(12) United States Patent
Takashima et al.

(10) Patent No.: US 10,366,891 B2
(45) Date of Patent: Jul. 30, 2019

(54) SEMICONDUCTOR DEVICE AND METHOD OF MANUFACTURING SEMICONDUCTOR DEVICE

(71) Applicant: FUJI ELECTRIC CO., LTD., Kanagawa (JP)

(72) Inventors: Shinya Takashima, Hachioji (JP); Katsunori Ueno, Matsumoto (JP); Masaharu Edo, Tokorozawa (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/936,436

(22) Filed: Mar. 27, 2018

(65) Prior Publication Data
US 2019/0115215 A1 Apr. 18, 2019

(30) Foreign Application Priority Data
Apr. 3, 2017 (JP) .................................. 2017-074037

(51) Int. Cl.
*H01L 29/207* (2006.01)
*H01L 21/225* (2006.01)
*H01L 29/20* (2006.01)
*H01L 29/66* (2006.01)
*H01L 21/265* (2006.01)
(Continued)

(52) U.S. Cl.
CPC ........ *H01L 21/2258* (2013.01); *H01L 21/266* (2013.01); *H01L 21/26553* (2013.01); *H01L 29/086* (2013.01); *H01L 29/1095* (2013.01); *H01L 29/2003* (2013.01); *H01L 29/207* (2013.01); *H01L 29/66522* (2013.01); *H01L 29/66712* (2013.01); *H01L 29/7802* (2013.01)

(58) Field of Classification Search
None
See application file for complete search history.

(56) References Cited

U.S. PATENT DOCUMENTS

2013/0316507 A1* 11/2013 Saitoh .................. H01L 29/2003
  438/285
2018/0026108 A1* 1/2018 Shimizu .................... G06F 1/26

FOREIGN PATENT DOCUMENTS

JP 2016021460 A 2/2016

OTHER PUBLICATIONS

D.G.Kent, et al., "Co-implantation of Be+O and Mg+O into GaN", Journal of Applied Physics, published Oct. 15, 2001, vol. 90, No. 8, p. 3750-p. 3753.

* cited by examiner

*Primary Examiner* — Benjamin P Sandvik

(57) ABSTRACT

A vertical semiconductor apparatus includes: a gallium nitride substrate; a gallium nitride semiconductor layer on the gallium nitride substrate; a p-type impurity region in the gallium nitride semiconductor layer and having an element to function as an acceptor for gallium nitride; an n-type impurity region in the p-type impurity region and having an element to function as a donor for gallium nitride; and an electrode provided contacting a rear surface of the gallium nitride substrate. The element to function as the donor in the n-type impurity region includes: a first impurity element to enter sites of gallium atoms in the gallium nitride semiconductor layer; and a second impurity element different from the first impurity element and to enter sites of nitrogen atoms in the gallium nitride semiconductor layer. In the n-type impurity region, a concentration of the first impurity element is higher than that of the second impurity element.

14 Claims, 12 Drawing Sheets

(51) Int. Cl.
*H01L 29/78* (2006.01)
*H01L 29/08* (2006.01)
*H01L 29/10* (2006.01)
*H01L 21/266* (2006.01)

SEMICONDUCTOR DEVICE AND METHOD OF MANUFACTURING SEMICONDUCTOR DEVICE

The contents of the following Japanese patent application are incorporated herein by reference:
NO. 2017-074037 filed in JP on Apr. 3, 2017.

BACKGROUND

1. Technical Field

The present invention relates to a semiconductor apparatus and a semiconductor apparatus manufacturing method.

2. Related Art

It is known that if an n-type region is formed by: ion implantation of n-type impurities into a p-type gallium nitride (GaN) layer formed by crystal growth; and subsequent thermal treatment, an element to function as an acceptor included in the p-type GaN layer is diffused downward below the p-type GaN layer. It is known that to cope with this, in order to suppress diffusion of the element to function as the acceptor (for example, magnesium (Mg)), oxygen (O) that has a smaller atomic weight than Mg, for example, and functions as a donor for GaN is ion-implanted (please see Patent Document 1, for example). It is known that if in the GaN layer, oxygen ions are implanted into a region to which magnesium ions are implanted and thermal treatment is subsequently performed on the GaN layer, the region becomes an n-type region with a low carrier concentration and poor characteristics (please see Non-Patent Document 1, for example).

Patent Document

[Patent Document 1] Japanese Patent Application Publication No. 2016-21460

Non-Patent Document

[Non-Patent Document 1] D. G. Kent, et al., "Co-Implantation of Be+O and Mg+O into GaN", Journal of Applied Physics, published 15 Oct. 2001, Volume 90, Number 8, 3750

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
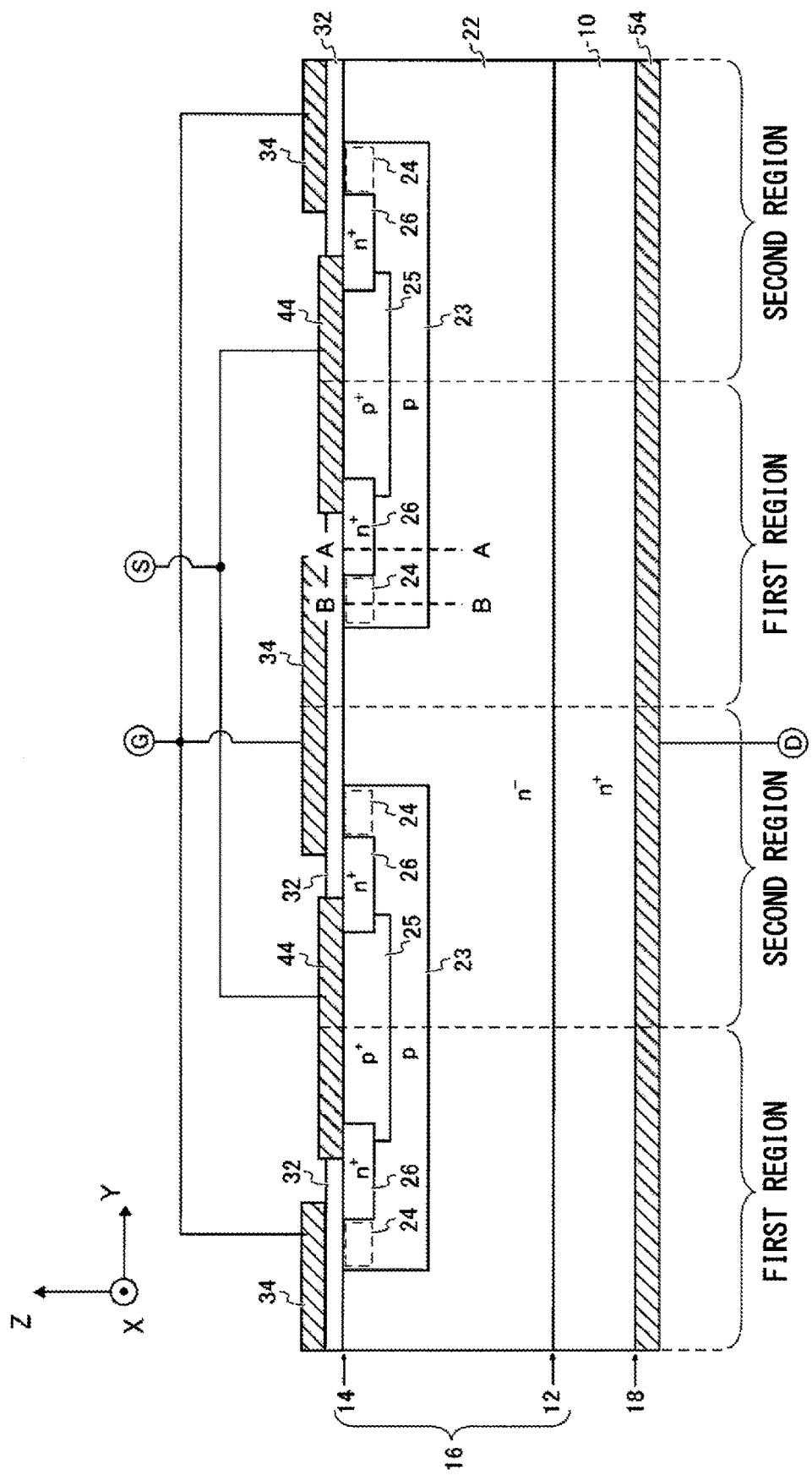
FIG. 1 is a sectional view showing the summary of a vertical MOSFET 100.

FIG. 1 is a sectional view showing the summary of a vertical MOSFET (Metal Oxide Semiconductor Field Effect Transistor) 100. FIG. 1 is also a Y-Z sectional view of the vertical MOSFET 100. In the present example, the X-axis direction and Y-axis direction are directions that are vertical to each other, and the Z-axis direction is the direction vertical to the X-Y plane. The X, Y and Z axes form a so-called right-handed system.

The vertical MOSFET 100 may have first regions and second regions provided alternately and repeatedly in the Y-axis direction. The first regions and second regions may each be a constituent unit of the vertical MOSFET 100. The first regions and second regions of the present example are axially symmetric about the Z-axis direction.

In the present example, the positive direction along the Z axis is referred to as the "upward" direction and the negative direction along the Z axis is referred to as the "downward" direction. The "upward" and "downward" directions do not necessarily mean directions perpendicular to the ground. In other words, the "upward" and "downward" directions are not limited by the direction of gravity. Phrases related to the "upward" and "downward" directions are merely expressions used for convenience to identify the relative positional relationships of regions, layers, films, substrates and the like. In the present example, the downward direction is also in some cases expressed as the depth direction.

The vertical MOSFET 100 of the present example is a planar-gate vertical MOSFET. In another example, the vertical MOSFET 100 may be a trench-gate vertical MOSFET. The vertical MOSFET 100 of the present example has a GaN substrate 10, a GaN layer 16, gate insulating films 32, gate electrodes 34, source electrodes 44 and a drain electrode 54.

The GaN substrate 10 is one example of a GaN single crystal substrate. The GaN substrate 10 of the present example is an n$^+$-type substrate. The GaN substrate 10 may be a low-dislocation, free-standing substrate. The GaN substrate 10 of the present example is a free-standing substrate with threading dislocation density which is lower than 1E+7 [cm$^{-2}$]. E means a power of 10. For example, 1E+7 means 1×10$^7$. By using a low dislocation density GaN substrate 10, the dislocation density of the GaN layer 16 formed on the GaN substrate 10 can also be lowered. Also, it is possible to prevent ion-implanted impurities from being diffused to a deep position along dislocation at the time of thermal treatment. Furthermore, using such a low-dislocation substrate allows reduction of leakage current even if a large area power device is formed. Thereby, power devices can be manufactured at a high yield.

In the present example, n and p mean that electrons and holes are the majority carriers, respectively. In addition, about + and − affixed to the upper right of n and p, n+ or p+ means that the carrier concentration is higher than what n or p without + indicates, and n− or p− means that the carrier concentration is lower than what n or p without − indicates.

The n-type impurity element to GaN may be one or more types of element among Si (silicon), Ge (germanium) and O (oxygen). In the present example, two types of element, Si and O, are used as the n-type impurity elements. Two types of element, Ge and O, may be used as the n-type impurity elements. Also, three types of element, Si, Ge and O, may be used as the n-type impurity elements. Also, the p-type impurity element to GaN may be one or more types of element among Mg (magnesium), Ca (calcium), Be (beryllium) and Zn (zinc). In the present example, Mg is used as the p-type impurity element.

Although in the vertical MOSFET 100 of the present example, the semiconductor material is GaN, the semiconductor material may include one or more elements among aluminum (Al) and indium (In). The semiconductor material may be a mixed crystal semiconductor including a trace amount of Al and In, that is, may be $Al_xIn_yGa_{1-x-y}N$ ($0 \leq x < 1$, $0 \leq y < 1$). However, the semiconductor material of the present example is GaN, which means x=y=0 in $Al_xIn_yGa_{1-x-y}N$.

The GaN layer 16 may be provided on the GaN substrate 10. The GaN layer 16 of the present example is epitaxially formed on the GaN substrate 10. The GaN layer 16 of the present example is an n⁻-type layer.

In the present example, the interface between the GaN layer 16 and the GaN substrate 10 is assumed to be a boundary 12. In the present example, the boundary 12 is a first main surface of the GaN substrate 10. A second main surface of the GaN substrate 10 is a rear surface 18 opposite to the boundary 12. Also, in the present example, a first main surface of the GaN layer 16 is a front surface 14 opposite to the boundary 12, and a second main surface of the GaN layer 16 is the boundary 12. The boundary 12 is one example of the rear surface of the GaN layer 16. Similar to the downward direction, the direction from the front surface 14 of the GaN layer 16 to the boundary 12 is also the depth direction.

The GaN layer 16 has p⁻-type base regions 23, p⁺-type contact regions 25, and n⁺-type source regions 26. In the present example, the base regions 23, contact regions 25 and source regions 26 are formed through implantation of impurity ions into the GaN layer 16 from the front surface 14 to reach respective predetermined depths. A technique of forming GaN regions having good p-type characteristics by providing recesses in the GaN layer and selectively epitaxially growing p-type GaN layers in the recesses is not established at the time of the application of the present application.

The base regions 23, contact regions 25 and source regions 26 may be well regions provided in the GaN layer 16. The base regions 23, contact regions 25 and source regions 26 may be well regions in stripe shapes extending in the X-axis direction. The base regions 23 are one example of a p-type impurity region. Also, the source regions 26 are one example of an n-type impurity region. Although the contact regions 25 are also p-type impurity regions, regions that are referred to simply as p-type impurity regions may be regarded as being the base regions 23 because the present specification focuses mainly on the base regions 23 and source regions 26 as mentioned below. However, as is obvious from explanation mentioned below, effects of the present application can be attained also for the contact regions 25 and the base regions 23 below the contact regions 25.

The base regions 23 and contact regions 25 of the present example are provided in the GaN layer 16. The base regions 23 and contact regions 25 of the present example include a p-type impurity element that functions as an acceptor for GaN. The base regions 23 and contact regions 25 of the present example include Mg which is a p-type impurity element that functions as an acceptor for GaN. The base regions 23 and contact regions 25 of the present example may be formed through Mg ion implantation and thermal treatment following the ion implantation.

The base regions 23 of the present example include channel formation regions 24. The channel formation regions 24 are parts of the base regions 23 positioned immediately below the gate insulating films 32. The channel formation regions 24 may be positioned, in the Y-axis direction, between a drift region 22 and the source regions 26. Also, the channel formation regions 24 may be exposed, at their upper portions, to the front surface 14, and may contact the gate insulating films 32 at the front surface 14.

The contact regions 25 are provided in the base regions 23. The contact regions 25 may have the function of reducing resistance of contact with the source electrode 44 and the function of providing paths for extracting holes at the time of gate-off. The contact regions 25 may be, at their upper portions, exposed to the front surface 14, and may contact the source electrodes 44 at the front surface 14. The contact regions 25 may contact, at their side portions, the source regions 26 and base regions 23, and may contact, at their bottom portions, the base regions 23.

The source regions 26 of the present example are provided in the GaN layer 16. More specifically, the source regions 26 of the present example are provided in the base regions 23 and contact regions 25. However, upper portions of the source regions 26 are positioned at the front surface 14 of the GaN layer 16. That is, upper portions of the source regions 26 are exposed to the front surface 14. The source regions 26 of the present example include n-type impurity elements that function as donors for GaN. The n-type impurity elements of the present example are Si and O. The source regions 26 of the present example may be formed through Si and O ion implantation and thermal treatment following the ion implantation.

The source regions 26 may provide paths through which electron current flows. Parts of the source regions 26 may contact the source electrodes 44 at the front surface 14. The source regions 26 may contact, at their bottom portions and side portions, the base regions 23 and contact regions 25.

The gate electrodes 34 may be provided on the gate insulating films 32 and in contact with the gate insulating films 32. The gate electrodes 34 may be positioned at least on the channel formation region 24. A gate electrode 34 of the present example is positioned on channel formation regions 24 and on the drift region 22 between two base regions 23. The gate electrodes 34 may be formed of polysilicon doped with impurities, and may be formed of an aluminum (Al)-silicon (Si) alloy.

The source electrodes 44 may be provided on the front surface 14. The source electrodes 44 of the present example are provided in contact with parts of the source regions 26 and the contact regions 25. The source electrodes 44 may be formed of Al or an Al-Si alloy. The source electrodes 44 may have barrier metal layers between the front surface 14 and Al layers or Al—Si layers. Titanium (Ti) may be used as a material of the barrier metal layers. In other words, the source electrodes 44 may be laminates of Ti layers and Al layers or laminates of Ti layers and Al—Si alloy layers.

The source electrodes 44 may be electrically separated from the gate electrodes 34 by interlayer dielectric films. In one example, the source electrodes 44 may also be provided also on interlayer dielectric films provided on the gate electrodes 34. The drain electrode 54 may be provided below the rear surface 18 in contact with the rear surface 18. The drain electrode 54 may also be constituted with the same material as the source electrodes 44.

In FIG. 1, a gate terminal, a source terminal and a drain terminal are indicated with G, D and S, respectively. For example, if a potential which is no lower than a threshold voltage is applied to the gate electrodes 34 through the gate terminal, inversion layers are formed in the channel formation regions 24. For example, if the drain electrode 54 is at a predetermined high potential and the source electrodes 44 are at the ground potential when inversion layers are formed, current flows from the drain terminal to the source terminal. Also, for example if a potential lower than a threshold voltage is applied to the gate electrodes 34, inversion layers in the channel formation regions 24 are extinguished, and current is blocked off. Thereby, the vertical MOSFET 100 can switch current between the source terminal and the drain terminal.

Figure 2:
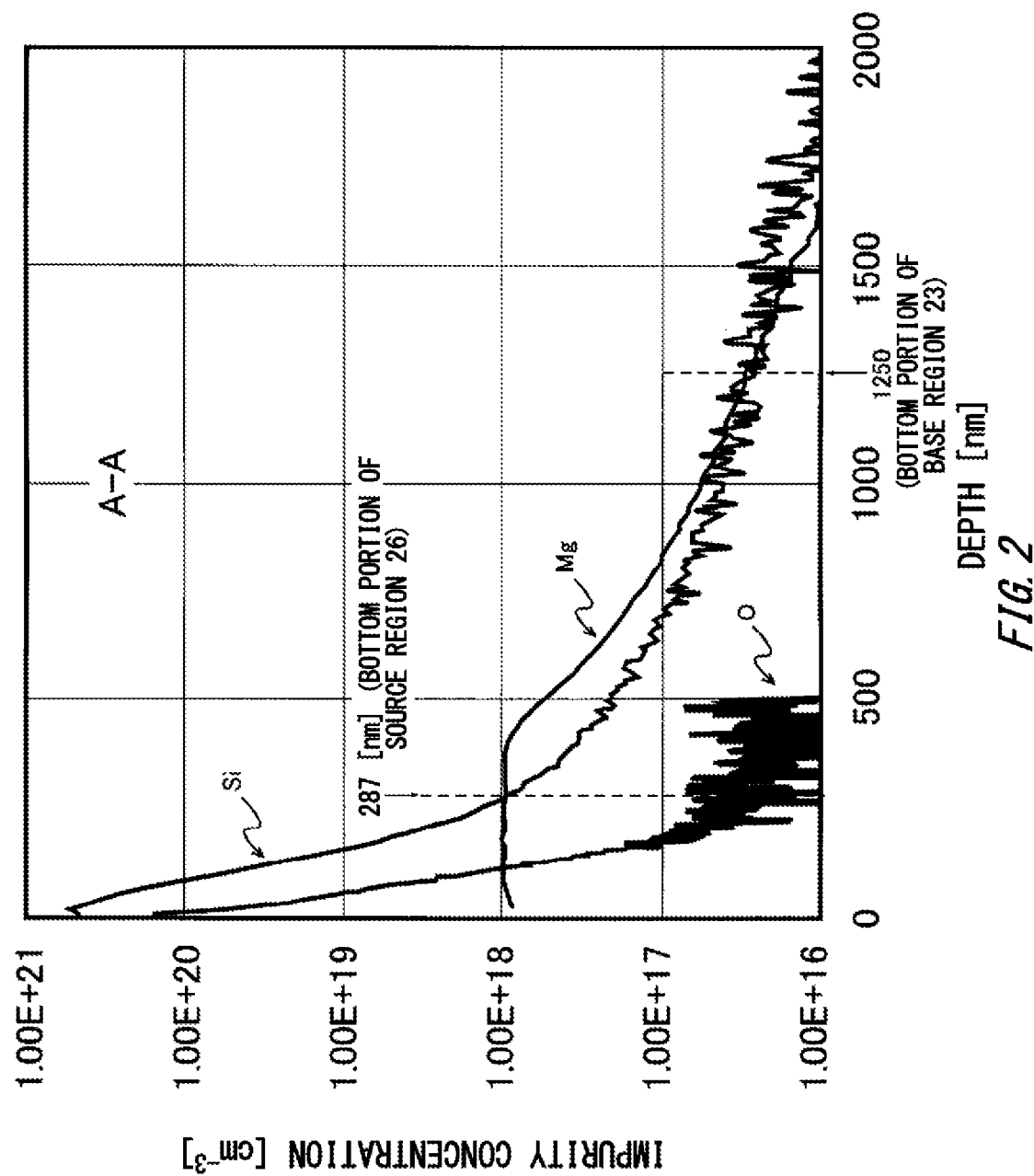
FIG. 2 is a figure showing the concentration distributions of Si, O and Mg along A-A in FIG. 1.

FIG. 2 is a figure showing the concentration distributions of Si, O and Mg along A-A in FIG. 1. A-A is a part of a straight line that passes through a source region 26, a base region 23 and the drift region 22 and is parallel with the Z-axis direction. The vertical axis indicates impurity concentrations (doping concentrations) [cm$^{-3}$], and the horizontal axis indicates the depth [nm] in the GaN layer 16. The front surface 14 is at the depth of 0 [nm].

Upper portions of the source regions 26 may be located within the depth range between 0 [nm] and 50 [nm] inclusive. Also, bottom portions of the source regions 26 may be located with the depth range between 100 [nm] and 300 [nm] inclusive. In the present example, the depth of 0 [nm] is where the upper portions of the source regions 26 are, and the depth of 287 [nm] is where the bottom portions of the source regions 26 are. In the present example, the magnitude relationship between the concentration of Si and the concentration of Mg is reversed above and below the depth of 287 [nm].

Upper portions of the base regions 23 may be located within the depth range between 0 [nm] and 50 [nm] inclusive. Also, bottom portions of the base regions 23 may be located in the depth range between 1100 [nm] and 1400 [nm] inclusive. Also, the bottom portions of the base regions 23 may be located at the depth where the monotonically decreasing p-type impurity concentration of the base region 23 becomes the same as the n-type impurity concentration of the drift region 22. In the present example, the depth of 1250 [nm] where the p-type impurity concentration of the base regions 23 and the n-type impurity concentration of the drift region 22 become the same is where the bottom portions of the base regions 23 are located.

In FIG. 2, the positions of the bottom portions of the contact regions 25 are not illustrated. However, in the present example, the contact regions 25 are formed to be deeper than the source regions 26. Therefore, the bottom portions of the source regions 26 are shallower than the bottom portions of both the base regions 23 and contact regions 25.

(n-Type Impurity Element) As the n-type impurity elements to function as donors, the source regions 26 of the present example have a first impurity element and a second impurity element different from the first impurity element. The first impurity element may be an element that enters sites of gallium atoms in the GaN layer 16. The first impurity element may be a group IV element, and more specifically may be Si and germanium (Ge). However, because carbon (C) can function as an acceptor in the GaN layer 16, desirably it is not used in ion implantation for forming the source regions 26. In the present example, the first impurity element is Si.

By implanting ions of the first impurity element into the GaN layer 16, vacancies of gallium atoms may be formed in the GaN layer 16. The vacancies of gallium atoms are equivalent to vacancies at sites of gallium atoms in the GaN layer 16 from which gallium atoms are eliminated. In the present example, the vacancies of gallium atoms are expressed as $V_{Ga}$. The ratio between the number of $V_{Ga}$ and the number of ion-implanted first impurity element may not necessarily be 1:1. The number of $V_{Ga}$ may be larger or smaller than the number of ion-implanted first impurity element. Also, among all the $V_{Ga}$, some $V_{Ga}$ may be occupied by the first impurity element, but some other $V_{Ga}$ may be left as vacancies.

The first impurity element ion-implanted into the GaN layer 16 may not necessarily entirely enter sites of gallium atoms. The first impurity element may be expressed as an element that easily enters sites of gallium atoms or an element that is highly likely to enter sites of gallium atoms. However, the concentration of the first impurity element in the GaN layer 16 may be assumed to be proportional to the dose [cm$^{-2}$] of the ion-implanted first impurity element. Also, the number of the first impurity element that enters sites of gallium atoms may also be assumed to be proportional to the dose [cm$^{-2}$] of the ion-implanted first impurity element.

The second impurity element may be an element that enters sites of nitrogen atoms in the GaN layer 16. In the present example, the second impurity element is O. However, in the present example, the second impurity element is assumed to be not nitrogen (N). In the present example, oxygen having entered sites of nitrogen atoms in the GaN layer 16 is expressed as $O_N$. $O_N$ may be regarded as O that is ion-implanted to replace N in the GaN layer 16. For example, N replaced by O may become nitrogen gas ($N_2$ gas) to be released to the outside of the GaN layer 16.

The second impurity element ion-implanted into the GaN layer 16 may not necessarily entirely enter sites of nitrogen atoms. The second impurity element may be expressed as an element that easily enters sites of nitrogen atoms or an element that is highly likely to enter sites of nitrogen atoms. However, the concentration of the second impurity element in the GaN layer 16 may also be assumed to be proportional to the dose [cm$^{-2}$] of the ion-implanted second impurity element. Also, the number of the second impurity element that enters sites of nitrogen atoms may be assumed to be proportional to the dose [cm$^{-2}$] of the ion-implanted second impurity element.

According to knowledge of the inventors of the present application, the p-type impurity element (for example, Mg) is easily gettered to $V_{Ga}$. Therefore, if $V_{Ga}$ is diffused downward below the GaN layer 16, Mg in the base regions 23 also is easily diffused downward below the GaN layer 16.

$V_{Ga}$ and $O_N$ easily form clusters of $V_{Ga}$—$O_N$. Then, $O_N$ introduced into the source regions 26 are not diffused downward below the GaN layer 16 unlike $V_{Ga}$. Without wishing to be bound by any particular theory, the inventors of the present application assume that formation of clusters by $O_N$ and $V_{Ga}$ formed in the source regions 26 due to ion implantation of the n-type impurities allows suppression of downward diffusion of Mg in the source regions 26 and base region 23 (that is, the line A-A in FIG. 2). In this manner, in the present example, purposely introducing the second impurity element allows suppression of diffusion of the p-type impurity element due to ion implantation of the n-type impurities.

In addition, because in the present example, the first impurity element is introduced, it is possible to solve a drawback that good n-type characteristics cannot be attained if ions of the second impurity element (O in the present example) are implanted into a region where Mg ions are implanted. In this manner, in the present example, n-type characteristics can be improved by the first impurity element (Si in the present example) that enters sites of gallium atoms while at the same time suppressing downward diffusion of Mg in the base regions 23 by the second impurity element (O in the present example) that enters sites of nitrogen atoms.

However, in the source regions 26, the first impurity element may be the major n-type impurities, and the second impurity element may be auxiliary n-type impurities. In the present example, Si is the major n-type impurities, and O is auxiliary n-type impurities. Therefore, in the source regions 26, the concentration of the first impurity element may be higher than the concentration of the second impurity element.

In the present example, Si ions are implanted into the GaN layer 16 through a screen film (also called a through film) made of silicon dioxide ($SiO_2$), so as to form the source regions 26. Thereby, O in silicon dioxide expelled by Si is introduced into GaN layer 16. In the present example, the amount of ion-implanted Si (the number of Si atoms) is sufficiently larger than the amount of O (the number of O atoms) taken into the GaN layer 16 by being expelled by Si. Therefore, in the source regions 26 of the present example, the concentration of the first impurity element (Si) is always higher than the concentration of the second impurity element (O) in the depth direction (that is, O concentration<Si concentration).

In addition, the impurity concentration distributions of the first and second impurity elements in the source regions 26 may have a tendency to decrease in the depth direction. For example, the impurity concentrations of the first and second impurity elements at bottom portions of the source regions 26 are lower than the impurity concentrations of the first and second impurity elements at upper portions of the source regions 26, respectively.

In the present example, the concentrations of Si and O gradually decrease in the depth direction. The Si concentration distribution of the present example has a peak in the vicinity of the front surface 14, decreases gradually from the peak, becomes 1E+18 [$cm^{-3}$] at the depth of 287 [nm], and becomes on the order of E+16 [$cm^{-3}$] at the depth of 2000 [nm]. Also, the O concentration distribution of the present example gradually decreases from the vicinity of the front surface 14, and becomes on the order of E+16 [$cm^{-3}$] in the depth range between 200 [nm] and 500 [nm] inclusive.

In the base regions 23 positioned below the boundary between the base regions 23 and the source regions 26 (that is, bottom portions of the source regions 26), the impurity concentration of the second impurity element may be no higher than 1E+17 $cm^{-3}$. In the present example, in a region where the O concentration is no higher than 1E+17 [$cm^{-3}$], O may be regarded as being on the order of a concentration corresponding to the lower detection limit of an SIMS (Secondary Ion Mass Spectrometry) apparatus, and also O may be regarded as being almost nonexistent in the region.

For example, it is possible to think of a situation where O is introduced into the base regions 23 entirely in the depth direction in order to introduce $O_N$ into the base regions 23 entirely in the depth direction (that is, the depth range ranging from the front surface 14 to bottom portions of the base regions 23). But because this degrades p-type characteristics of the base regions 23, it is not preferable to introduce O into the base regions 23 entirely in the depth direction. In the present example, by effectively introducing O (for example, attaining the O concentration of 1E+17 [$cm^{-3}$] in the depth range ranging from the front surface 14 to the depth of 200 [nm]) in the vicinity of the front surface 14, it is possible to suppress diffusion of Mg by $O_N$—$V_{Ga}$ while at the same time restraining degradation of p-type characteristics in the base regions 23.

The impurity concentration of the second impurity element in the source regions 26 may be no lower than 0.1% and no higher than 50% of the impurity concentration of the first impurity element in the source regions 26, and more preferably, may be no lower than 1% and no higher than 20%. For example, if the Si concentration is 1E+19 [$cm^{-3}$], the O concentration is 1E+17 [$cm^{-3}$] (the O concentration is 1% of the Si concentration). Also, for example, if the Si concentration is 4.98E+20 [$cm^{-3}$], the O concentration is 1.7E+20 [$cm^{-3}$] (the O concentration is approximately 34% of the Si concentration).

In this manner, by making the impurity concentration of the first impurity element sufficiently higher than the impurity concentration of the second impurity element in the source regions 26, sufficient n-type characteristics can be ensured by the first impurity element. Also, by making the impurity concentration of the second impurity element no lower than 0.1%, more preferably no lower than 1% of the impurity concentration of the first impurity element in the source regions 26, formation of clusters of $O_N$—$V_{Ga}$ can be ensured.

The impurity concentration distributions of the first and second impurity elements in the source regions 26 may have peaks in the depth range between the front surface 14 and 50 [nm]. In the present example, there is a peak of the Si concentration distribution at the depth position of 20 [nm] from the front surface 14. In the present example, the peak concentration of Si is 4.98E+20 [$cm^{-3}$]. Also, the peak concentration of O is 1.7E+20 [$cm^{-3}$]. As long as the relationship O concentration<Si concentration is kept, the peak concentration of Si may be made no lower than 1E+19 [$cm^{-3}$] and no higher than 1E+21 [$cm^{-3}$].

Instead of that the impurity concentration distributions have peak concentrations, the impurity concentration distributions of the first and second impurity elements in the source regions 26 may have flat regions ranging from the front surface 14 to a predetermined depth of the source regions 26. However, in order not to degrade n-type characteristics, the concentration of the first impurity element is always kept higher than the concentration of the second impurity element also in the regions where the impurity concentration distributions are flat in the depth direction (in other words, the regions where the impurity concentrations remain constant).

In the present example, that an impurity concentration distribution is flat in the depth direction means that the impurity concentration is not simply increasing or simply decreasing in a predetermined depth range and additionally its deviation from a predetermined concentration is within ±25%. For example, if the predetermined concentration is 5E+20 [$cm^{-3}$], and an impurity concentration is increasing or decreasing in the range between 3.75E+20 [$cm^{-3}$] and 6.25E+20 [$cm^{-3}$] inclusive, the impurity concentration distribution may be regarded as being flat in the depth direction.

In one example, entirely in the depth direction of the source regions 26, the impurity concentration distribution of the first impurity element may be flat in the depth direction. Thereby, because the first impurity element (Si, etc.) can be sufficiently ensured over the entire source regions 26, n-type characteristics can further be improved as compared to a situation where there is a peak. Also, in one example, the impurity concentration distribution of the second impurity element may be flat in the depth direction. However, in order not to degrade p-type characteristics of the base regions 23, the region where the impurity concentration distribution of the second impurity element is flat is preferably set to spread from the front surface 14 to a half of the depth of the source regions 26 at most. Thereby, $O_N$ can be introduced into a wider range of the source regions 26 as compared to a situation where there is a peak.

In another embodiment (corresponding to a second embodiment mentioned below), ions of the first and second impurity elements may be implanted into the GaN layer 16 not through a screen film including the second impurity element. For example, in order to form the source regions 26, ions of the first impurity element may be implanted into the GaN layer 16, and thereafter ions of the second impurity element may be implanted into the GaN layer 16. Also, instead of this, in order to form the source regions 26, ions of the first and second impurity elements may be simultaneously implanted into the GaN layer 16. In either case, $V_{Ga}$ can be formed in the GaN layer 16 by the first impurity element, and the second impurity element can be allowed to enter $V_{Ga}$.

In the other embodiment also, the impurity concentration distributions of the first impurity element and second impurity element in the source regions 26 may have a tendency to decrease in the depth direction. In the other embodiment, the profiles of the impurity concentration distributions of the first and second impurity elements can be made different from each other by separately implanting the respective ions of the first and second impurity elements. For example, in order to ensure good n-type characteristics, ions of the first impurity element may be implanted so as to make flat the impurity concentration distribution of the first impurity element in the depth direction.

In contrast to this, ions of the first and second impurity elements may be implanted so that the impurity concentration distributions of the first and second impurity elements have peaks in the vicinity of the front surface 14. The impurity concentration distribution of the first impurity element may be set to be flat in the depth direction, and the impurity concentration distribution of the second impurity element may be set to have a peak in the vicinity of the front surface 14. Furthermore, the impurity concentration distribution of the first impurity element may be set to have a peak at the front surface 14, and the impurity concentration distribution of the second impurity element may be set to be flat in the depth direction. However, in order to ensure good n-type characteristics, the impurity concentration of the second impurity element is always kept lower than the impurity concentration of the first impurity element.

(p-Type Impurity Element) The impurity concentration distribution of the p-type impurity element may be flat from the front surface 14 to a predetermined depth. In the present example, the impurity concentration distribution of Mg is flat from the vicinity of the front surface 14 to the depth of approximately 400 [nm]. Also, the impurity concentration distribution of the p-type impurity element in the base regions 23 may include a portion having a tendency to decrease in the depth direction. In the present example, the Mg concentration monotonically decreases from the depth of approximately 400 [nm] to the depth of approximately 1650 [nm]. The monotonic decrease of the Mg concentration may be seen as evidence that the $p^-$-type base regions 23 are formed by ion implantation.

In the present example, Mg ions are selectively implanted into the GaN layer 16, and thermal treatment is performed after the ion implantation to form the p-type impurity regions. Thereby, in the base regions 23 and drift region 22 of the GaN layer 16, a tail region where the impurity concentration of Mg monotonically decrease in the depth direction is formed. In the present example, the tail region in the impurity concentration distribution of Mg may be regarded as a feature reflecting that Mg ions are implanted.

Figure 3:
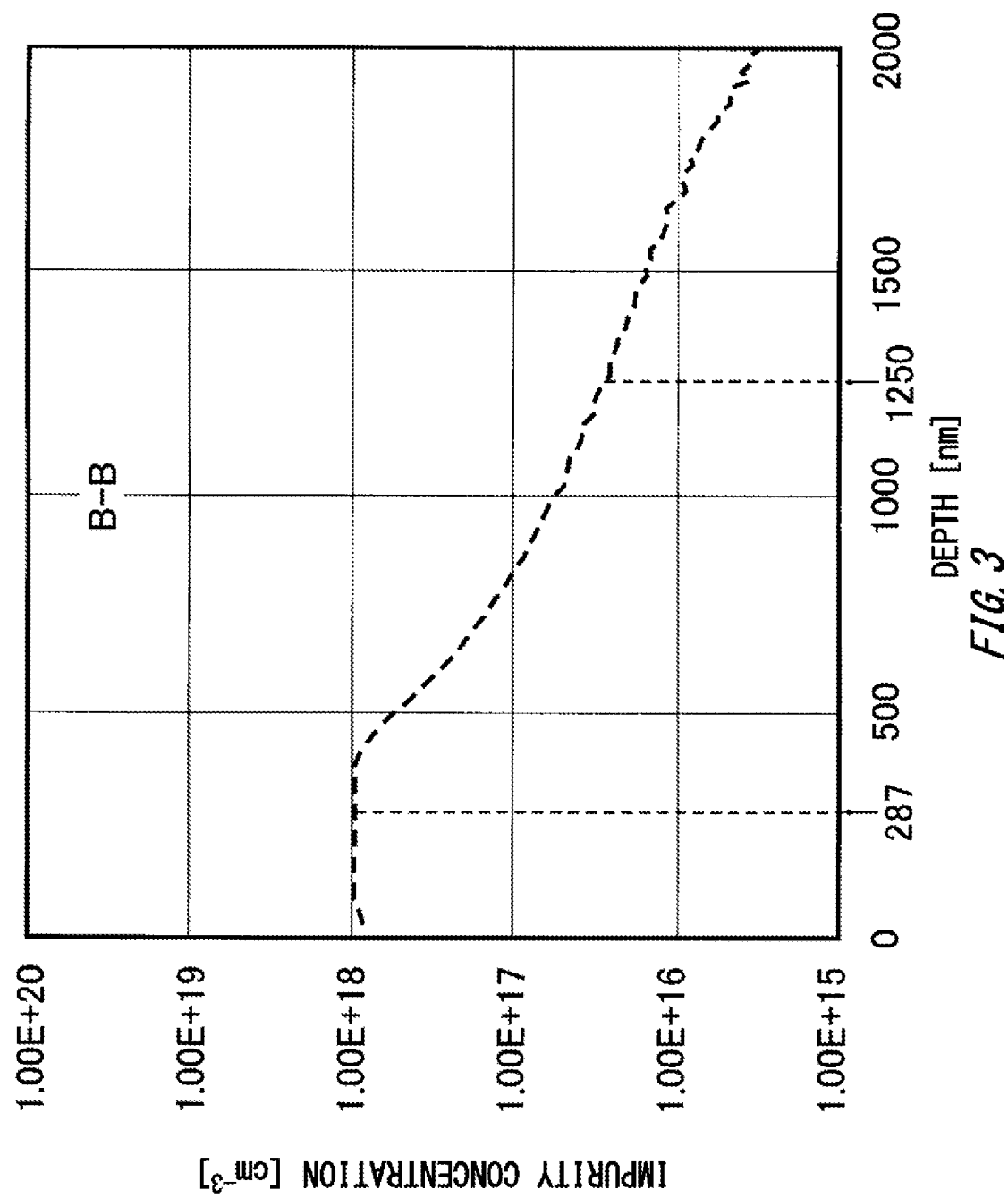
FIG. 3 is a figure showing the concentration distribution of Mg along B-B in FIG. 1.

FIG. 3 is a figure showing the concentration distribution of Mg along B-B in FIG. 1. B-B is a part of a straight line that does not pass through a source region 26, but passes through a channel formation region 24, a base region 23 and the drift region 22 and is parallel with the Z-axis direction. The vertical axis and horizontal axis are the same as those in FIG. 2.

Figure 4:
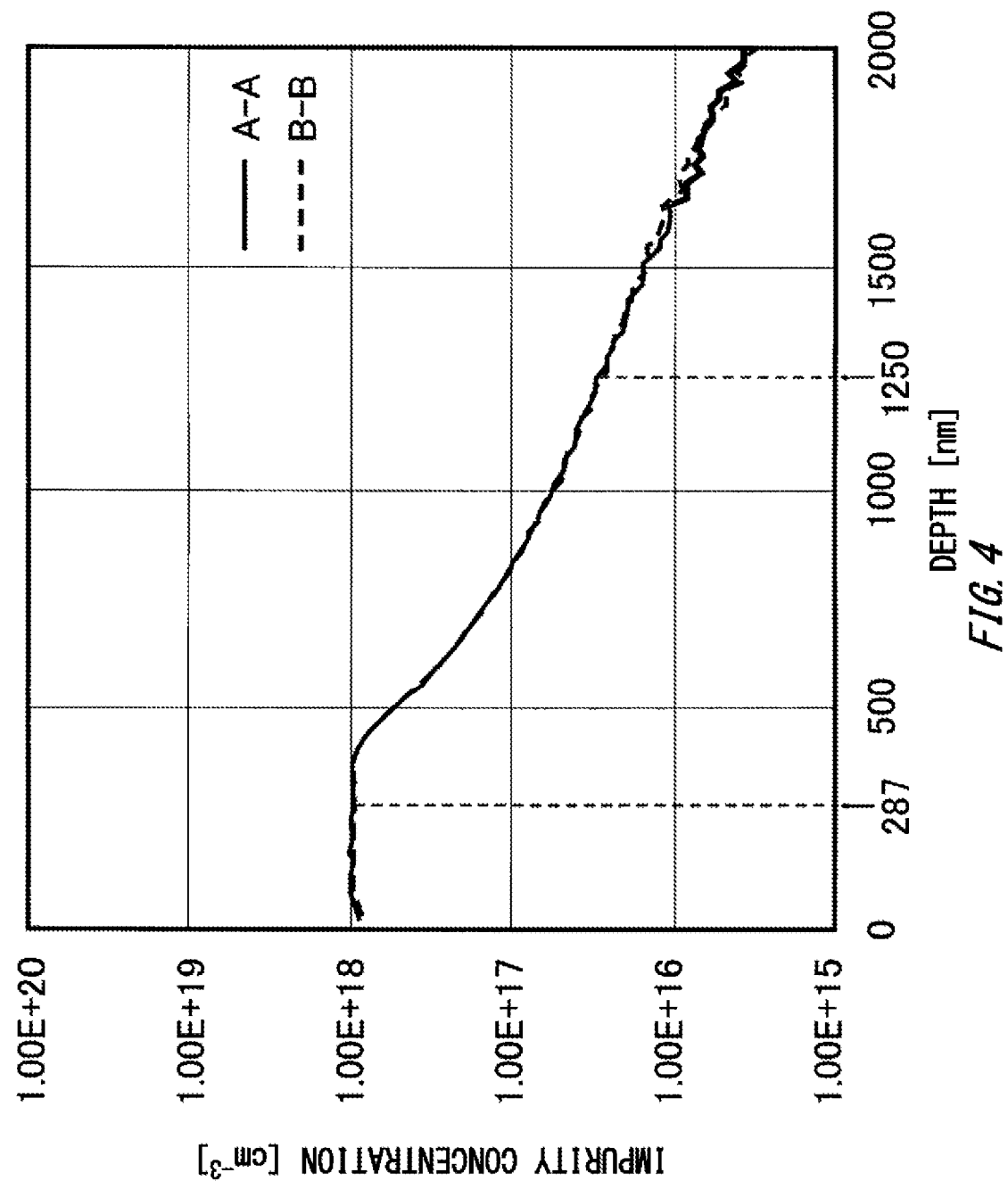
FIG. 4 is a figure in which the concentration distributions of Mg along A-A and B-B in FIG. 1 are superimposed.

FIG. 4 is a figure in which the concentration distributions of Mg along A-A and B-B in FIG. 1 are superimposed. As shown in FIG. 4, the concentration distributions of Mg along A-A and B-B in FIG. 1 almost completely matched. In other words, the impurity concentration distribution of Mg in base regions 23 positioned below the source regions 26 and the impurity concentration distribution of Mg in base regions 23 not positioned below the source regions 26 were the same.

That the impurity concentration distributions of Mg are the same may mean that the difference between the respective concentrations in the first Mg concentration distribution and second Mg concentration distribution measured in the depth direction is within the range of errors of measurement by an SIMS apparatus. Also, that the impurity concentration distributions of Mg are the same may mean that the first Mg concentration distribution measured in the depth direction is within ±50% of the second Mg concentration distribution, and more desirably may mean that it is within ±30% of the second Mg concentration distribution.

It was possible to suppress downward diffusion of Mg both in base regions 23 immediately below the source regions 26 (A-A) and in base regions 23 immediately below the channel formation regions 24 (B-B). In this manner, effectiveness of implanting ions of the first impurity element (Si, etc.) and the second impurity element (O, etc.) as n-type impurities has become clear.

The concentration distribution of Mg along B-B to which ions of the second impurity element are not implanted is characteristically the same as that along A-A. Although there is a possibility for p-type impurities to be diffused downward below the source regions 26 due to ions of the n-type impurities being implanted, it is assumed that in the present example, clusters of $O_N$—$V_{Ga}$ suppressed diffusion of Mg along the line of A-A as observed along the line of B-B.

Figure 5:
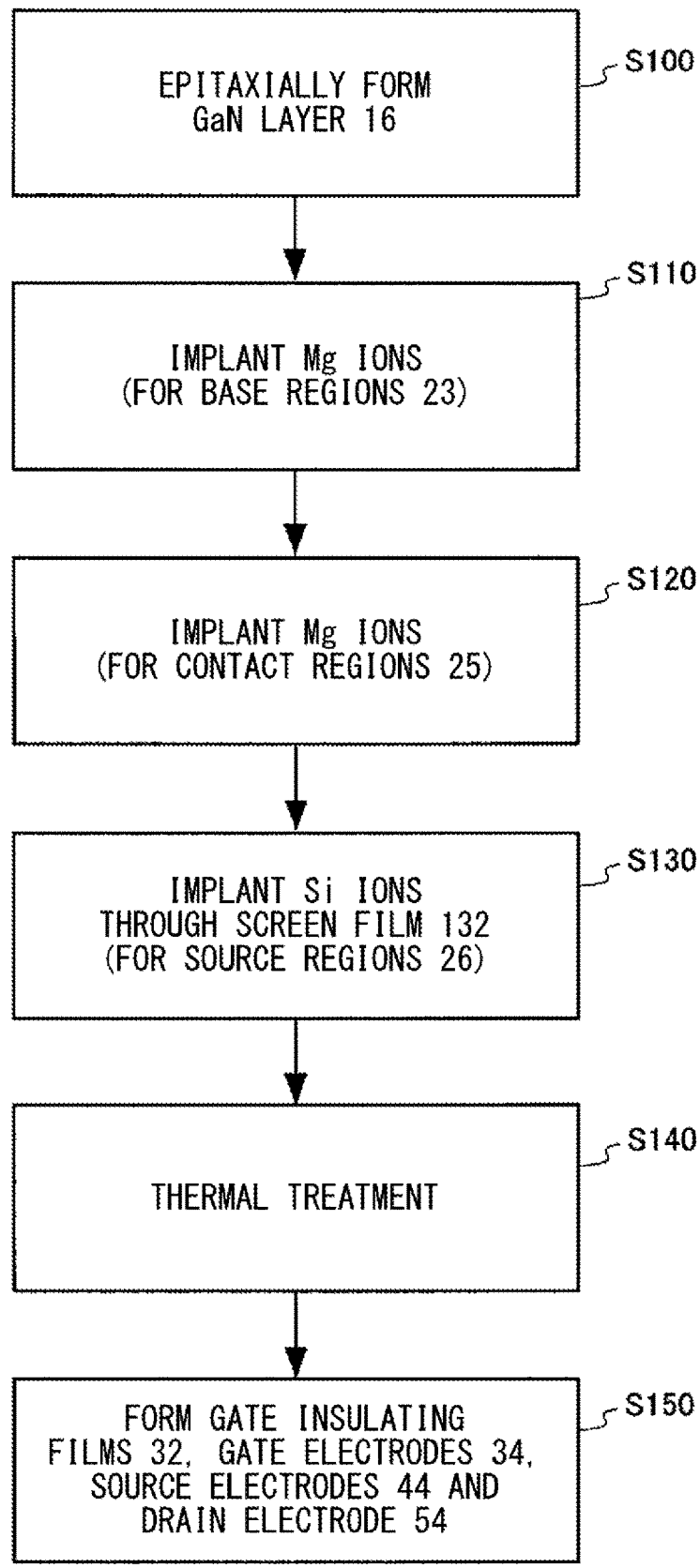
FIG. 5 is a flow diagram showing a process of manufacturing the vertical MOSFET 100 in a first embodiment.

FIG. 5 is a flow diagram showing a process of manufacturing the vertical MOSFET 100 in a first embodiment. The manufacturing process of the present example is performed in the order from Step S100 to S150 (that is, the ascending order of the numbers).

Figure 6:
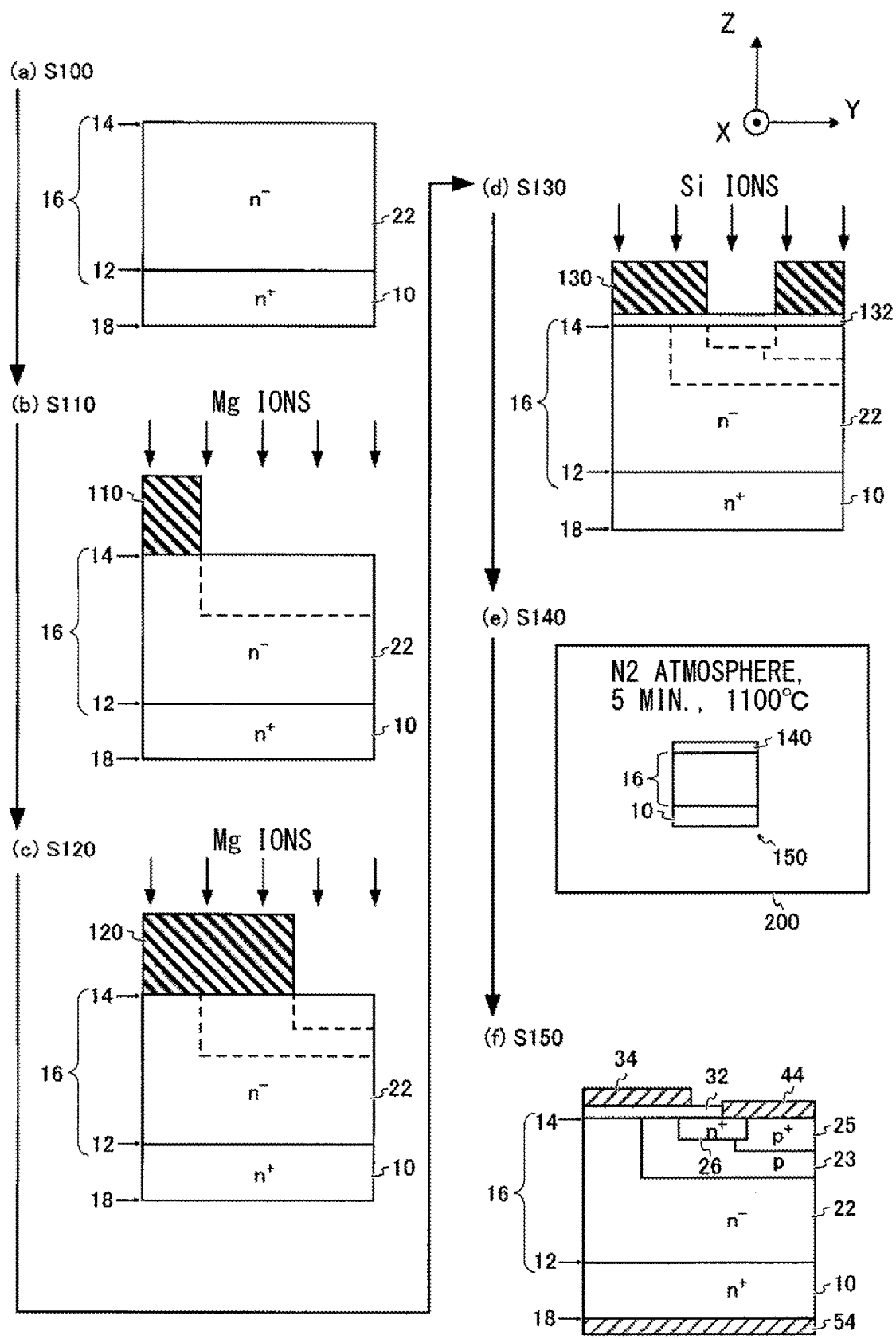
FIG. 6 shows (a) to (f) showing Steps S100 to S150 in the first embodiment, respectively.

FIG. 6 shows (a) to (f) showing Steps S100 to S150 in the first embodiment, respectively. Considering the visibility of figures, in (a) to (f) of FIG. 6, only a first region in FIG. 1 is illustrated.

(a) in FIG. 6 is a figure showing Step S100. At Step S100, the GaN layer 16 is epitaxially formed on the GaN substrate 10. At Step 5100 of the present example, the n-type GaN layer 16 is epitaxially formed on the n$^+$-type GaN substrate 10 by metal organic chemical vapor deposition (MOCVD), halide vapor phase epitaxy (HYPE) or the like. The epitaxially formed GaN layer 16 may have the n-type impurity element (for example, Si) in an amount which is no smaller than 5E+15 cm$^{-3}$ and no larger than 5E+16 cm$^{-3}$. The thickness of the GaN layer 16 (that is, the length from the boundary 12 to the front surface 14) may be varied depending on the withstand voltage, but is for example several μm to 50 μm inclusive.

(b) in FIG. 6 is a figure showing Step S110. At Step S110 of the present example, Mg ions are implanted into the GaN layer 16 in order to form the base regions 23. In the present example, Mg ions are implanted into the GaN layer 16 through a mask 110 having openings in regions corresponding to the base regions 23. The mask 110 may be a silicon dioxide (SiO$_2$) mask or photoresist mask that allows selective removal from the GaN layer 16.

The ion implantation acceleration energy may be varied according to implantation depths. The acceleration energy is proportional to an acceleration voltage. The higher the acceleration voltage is, the higher the energy of impurities can be made. The higher the acceleration voltage is, the deeper the implantation depth becomes In the present example, Mg ions are implanted into the GaN layer 16 by implantation at multiple steps under conditions of acceleration voltages of 20, 40, 70, 110, 150, 200, 250 and 430 (all in keV), and doses which are no smaller than 1E+12 cm$^{-2}$ and no larger than 1E+14 cm$^{-2}$. The lower the acceleration voltage is, the smaller the dose may be made, and the higher the acceleration voltage is, the larger the dose may be made. The implantation depth may be within the range between the front surface 14 and the depth of 1.25 μm. After the ion implantation, the mask 110 is removed.

(c) in FIG. 6 is a figure showing Step S120. At Step S120 of the present example, Mg ions are implanted into the GaN layer 16 in order to form the contact regions 25. In the present example, Mg ions are implanted into the GaN layer 16 through a mask 120 having openings in regions corresponding to the contact regions 25. The acceleration voltage and dose may be adjusted as appropriate relative to those at Step S110, in order to implant Mg ions at a high concentration at positions shallower than the base regions 23. Thereby, a peak of the impurity concentration distribution may be formed in the vicinity of the front surface 14. For example, a peak of the Mg concentration distribution at which the Mg concentration is no lower than 1E+19 cm$^{-3}$ is formed in the range between the front surface 14 and the depth of 50 nm. After the ion implantation, the mask 120 is removed.

(d) in FIG. 6 is a figure showing Step S130. At Step S130 of the present example, ions of the n-type impurity elements are implanted into regions to be the base regions 23 after thermal treatment, in order to form the source regions 26. In the present example, ions of the n-type impurity elements are implanted also into the contact regions 25.

At Step S130 of the present example, first, a screen film 132 with a thickness of 20 [nm] provided over the entire front surface 14 is formed. The screen film 132 of the present example is a thin film made of silicon oxide formed by PECVD (Plasma-Enhanced Chemical Vapor Deposition) (for example, a SiO$_2$ thin film). Thereafter, a photoresist mask 130 having openings in regions corresponding to the source regions 26 is formed.

Thereafter, ions of the first impurity element (Si in the present example) are implanted into regions to be the base regions 23 by implantation at multiple steps, through the screen film 132 and the photoresist mask 130. In more detail, Si ions are implanted into regions to be the base regions 23 under the conditions of: the acceleration voltage of 30 [keV] and the dose of 6.0E+14 [cm$^{-2}$]; the acceleration voltage of 60 [keV] and the dose of 8.0E+14 [cm$^{-2}$]; and the acceleration voltage of 80 [keV] and the dose of 1.6E+15 [cm$^{-2}$]. In the present example, O which is the second impurity element is introduced from the screen film 132 into regions to be base regions 23. After the ion implantation, the screen film 132 and photoresist mask 130 are removed.

(e) in FIG. 6 is a figure showing Step S140. At Step S140 of the present example, first, a cap layer 140 is formed on the entire front surface 14 of the GaN layer 16, and a laminate 150 consisting of the GaN substrate 10, GaN layer 16 and cap layer 140 is formed. Thereafter, the laminate 150 is arranged in a thermal treatment apparatus 200, and the laminate 150 is subjected to thermal treatment at temperature which is no lower than 1000° C. Thereby, the p$^-$-type base regions 23, p$^+$-type contact regions 25, and n$^+$-type source regions 26 are formed in the GaN layer 16.

The cap layer 140 may have the function of preventing nitrogen atoms from being released from the GaN layer 16 during the thermal treatment. Desirably, the cap layer 140 is highly heat-resistant, has a good property to adhere to the front surface 14, does not allow diffusion of impurities from the cap layer 140 to the GaN layer 16 and can be selectively removed from the GaN layer 16. That the cap layer 140 is highly heat-resistant means that the cap layer 140 is substantially not decomposed to the degree that pits (through-openings) are formed in the cap layer 140 even if subjected to thermal treatment at temperature which is no lower than 1100° C. and no higher than 1400° C.

Although the cap layer 140 of the present example is an AlN layer, it may be a silicon dioxide (SiO$_2$) layer or a silicon nitride (SiN) layer. However, it is more desirably an AlN layer in order to eliminate the possibility of Si or O being diffused to the GaN layer 16. As a variant, the screen film 132 formed at Step S130 may not be removed, and an AlN layer may be formed on the screen film 132 to use the screen film 132 and AlN layer as the cap layer 140.

In the thermal treatment apparatus 200, the laminate 150 may be subjected to thermal treatment at temperature which is no lower than 1100° C. and no higher than 1400° C., more preferably no lower than 1300° C. and no higher than 1400° C. The laminate 150 may be subjected to thermal treatment in a nitrogen gas atmosphere. In the present example, the laminate 150 is subjected to thermal treatment for five minutes at 1100° C. in a nitrogen gas atmosphere. After the thermal treatment, the cap layer 140 is removed. The AlN layer may be removed by potassium hydroxide solution (KOHaq) and the SiO$_2$ layer may be removed by hydrofluoric acid (HF).

(f) in FIG. 6 is a figure showing Step S150. At Step S150 of the present example, the gate insulating films 32, gate electrodes 34, source electrodes 44 and drain electrode 54 are formed. At Step S150, the gate insulating films 32 to cover at least the base regions 23 exposed to the front surface 14 are formed. For example, an insulating film is formed by PECVD, and thereafter, through photolithography and etching steps, the insulating film is shaped into a predetermined shape. Thereby, the gate insulating films 32 may be formed. The gate insulating films 32 may have a thickness of 100 nm. The gate insulating films 32 may be a $SiO_2$ film or may be an aluminum oxide ($Al_2O_3$) film.

After forming the gate insulating films 32, the gate electrodes 34, source electrodes 44 and drain electrode 54 are formed sequentially. Each among the gate electrodes 34, source electrodes 44 and drain electrode 54 may be formed through sputtering, photolithography, etching or the like.

Figure 7:
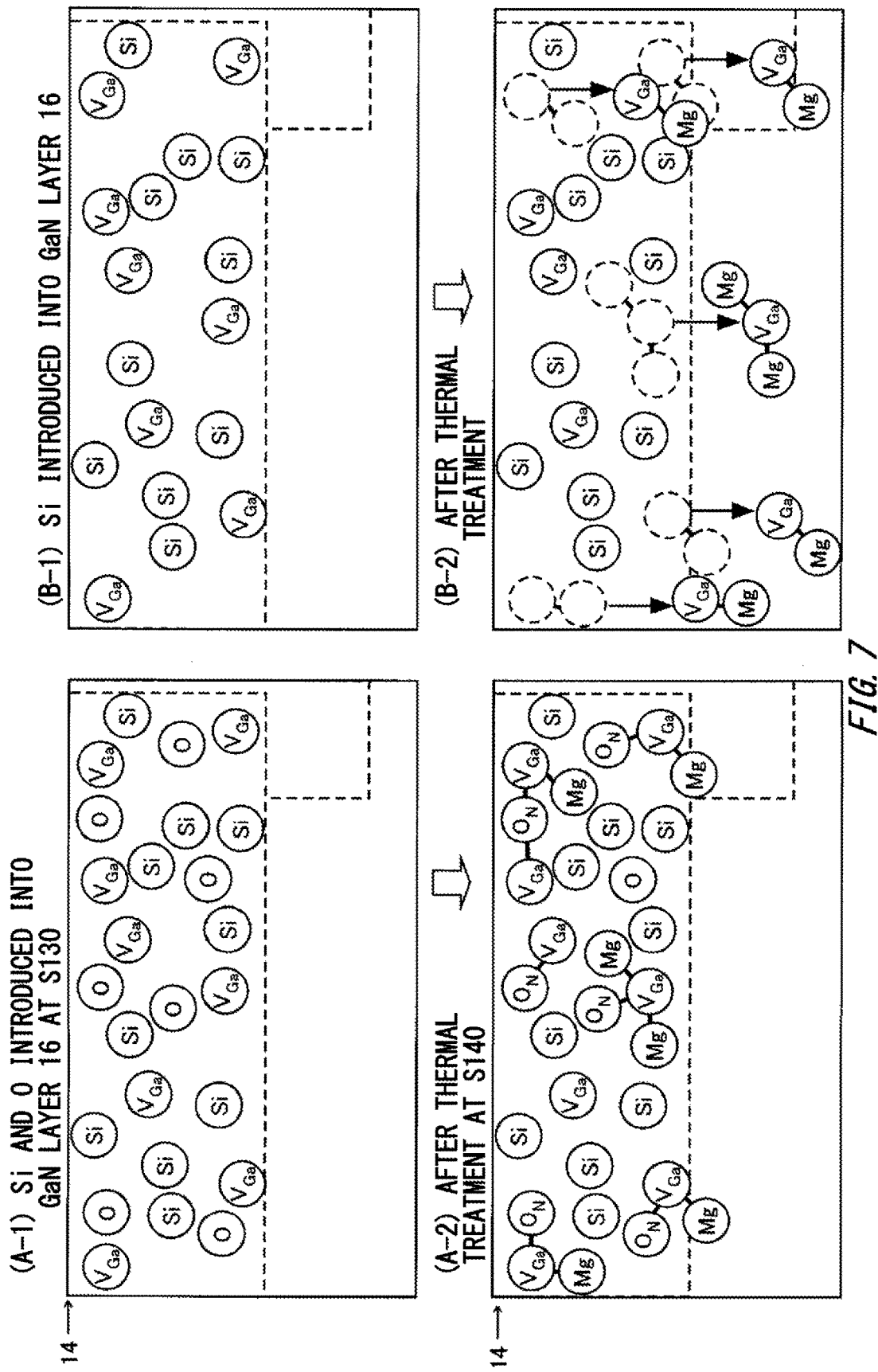
FIG. 7 shows (A-1) and (A-2) showing how it appears when Mg is not diffused if O is introduced into a GaN layer 16 and (B-1) and (B-2) showing how it appears when Mg is diffused if O is not introduced into the GaN layer 16.

FIG. 7 shows (A-1) and (A-2) showing how it appears when Mg is not diffused if O is introduced into the GaN layer 16 and (B-1) and (B-2) showing how it appears when Mg is diffused if O is not introduced into the GaN layer 16. FIG. 7 is also a partially enlarged figure of a region corresponding to a source region 26. FIG. 7 is a conceptual diagram for explaining the above-mentioned principle of the present application.

(A-1) shows how it appears when Si and O are introduced into the GaN layer 16. Also, (A-2) shows how it appears after the GaN layer 16 is subjected to thermal treatment after the state shown in (A-1). As mentioned above, in the present example in which Si and O are introduced into the GaN layer 16, downward diffusion of Mg is suppressed by formation of clusters by $O_N$ and $V_{Ga}$.

(B-1) shows how it appears when only Si is introduced into the GaN layer 16. Also, (B-2) shows how it appears after the GaN layer 16 is subjected to thermal treatment after the state shown in (B-1). Because $O_N$ does not exist in (B-2), Mg is diffused downward together with $V_{Ga}$.

Figure 8:
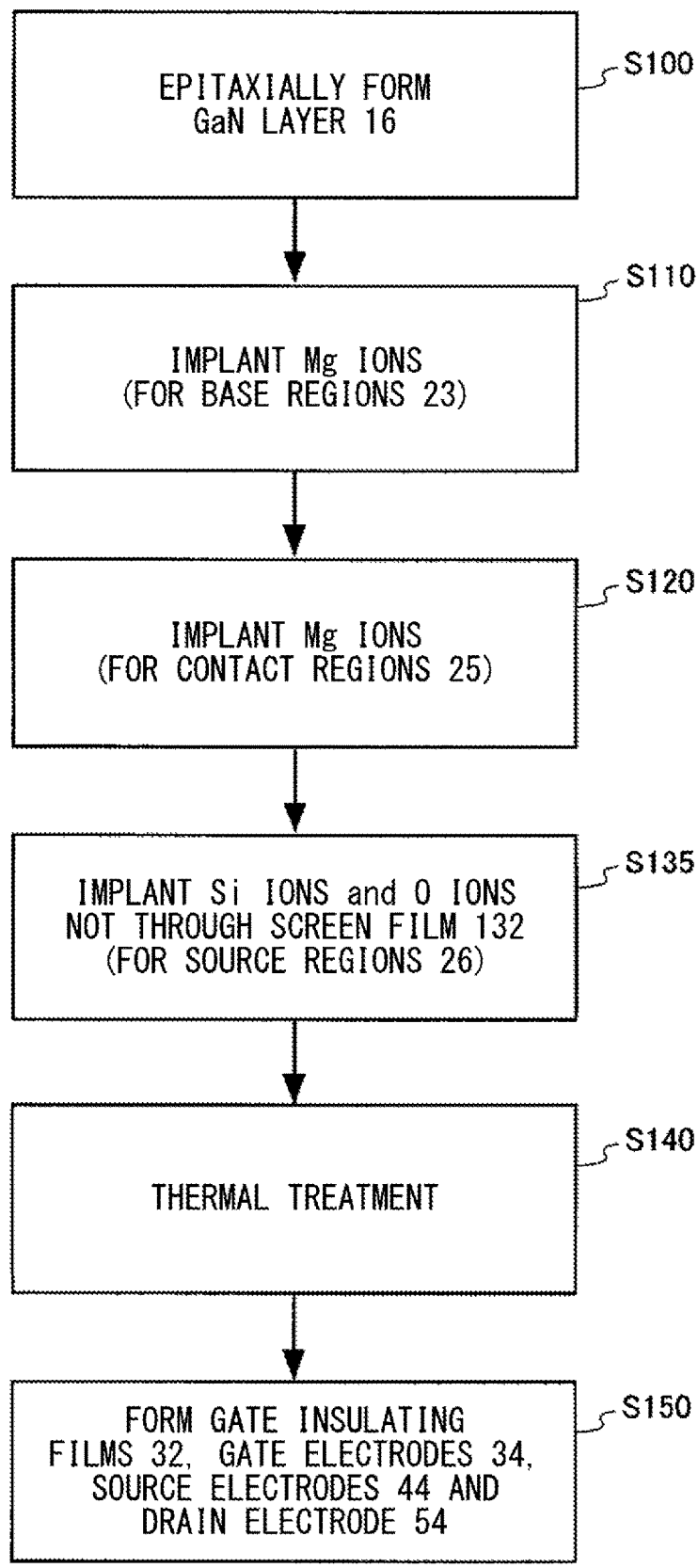
FIG. 8 is a flow diagram showing a process of manufacturing the vertical MOSFET 100 in a second embodiment.

FIG. 8 is a flow diagram showing a process of manufacturing the vertical MOSFET 100 in the second embodiment. In the present example, instead of Step S130 in which n-type impurities are ion-implanted through the screen film 132, Step S135 is provided, in which ions of the first impurity element and second impurity element, which are n-type impurities, are implanted into regions to be the base regions not through the screen film 132. This is the difference from the first embodiment. In other respects, it is the same as the first embodiment.

Figure 9:
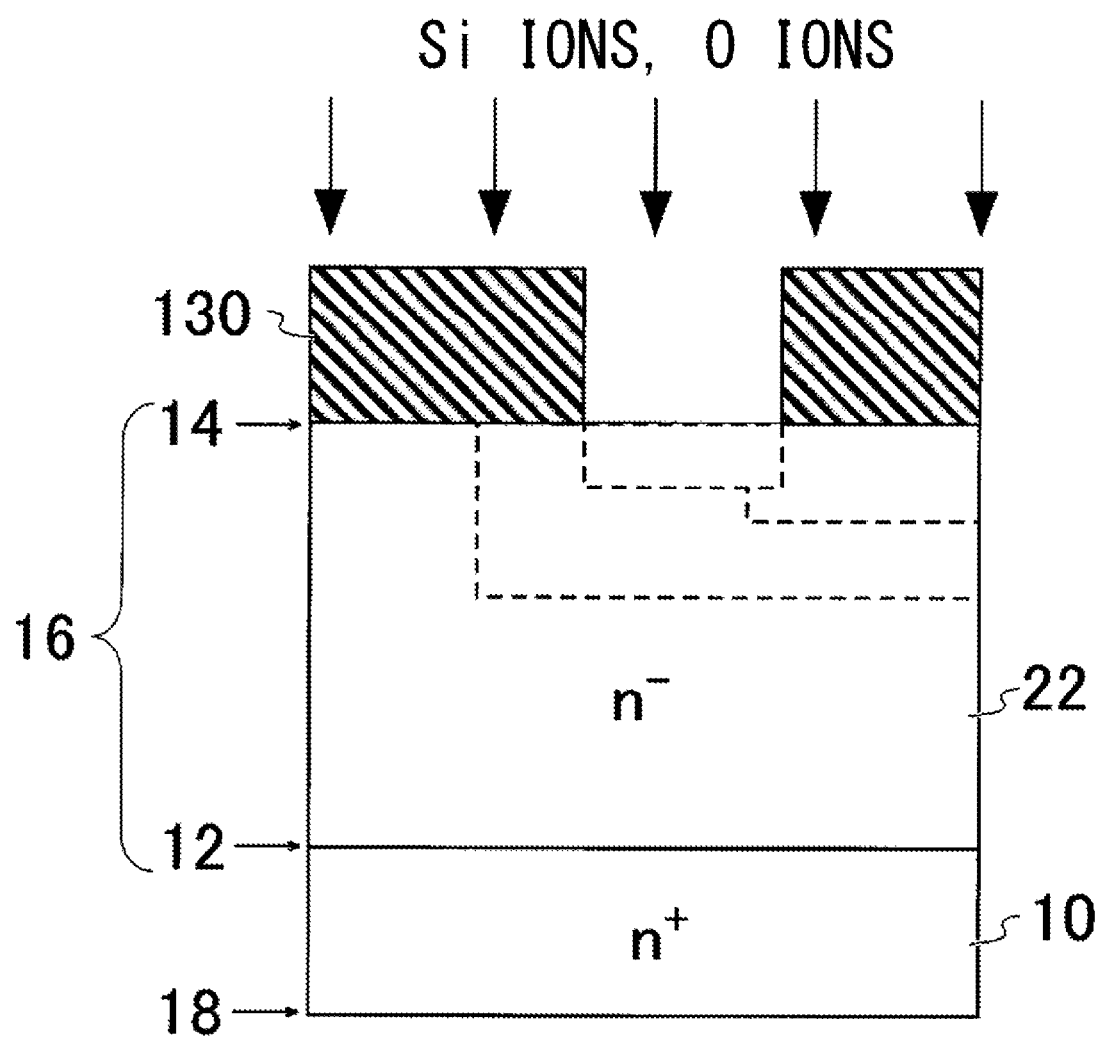
FIG. 9 is a figure showing Step S135 in the second embodiment.

FIG. 9 is a figure showing Step 5135 in the second embodiment. At Step S135 of the present example, first, the photoresist mask 130 having openings on regions corresponding to the source regions 26 is formed. Thereafter, ions of the first impurity element (Si in the present example) and the second impurity element (O in the present example) are implanted into regions to be the base regions 23 by implantation at multiple steps, through the photoresist mask 130. The conditions of the ion implantation may be the same as those at Step 5130 in the first embodiment. Si ions and O ions may be implanted into the base regions 23 and the contact regions 25, respectively. After Si ions are implanted, O ions may be implanted through the same photoresist mask 130.

Figure 10:
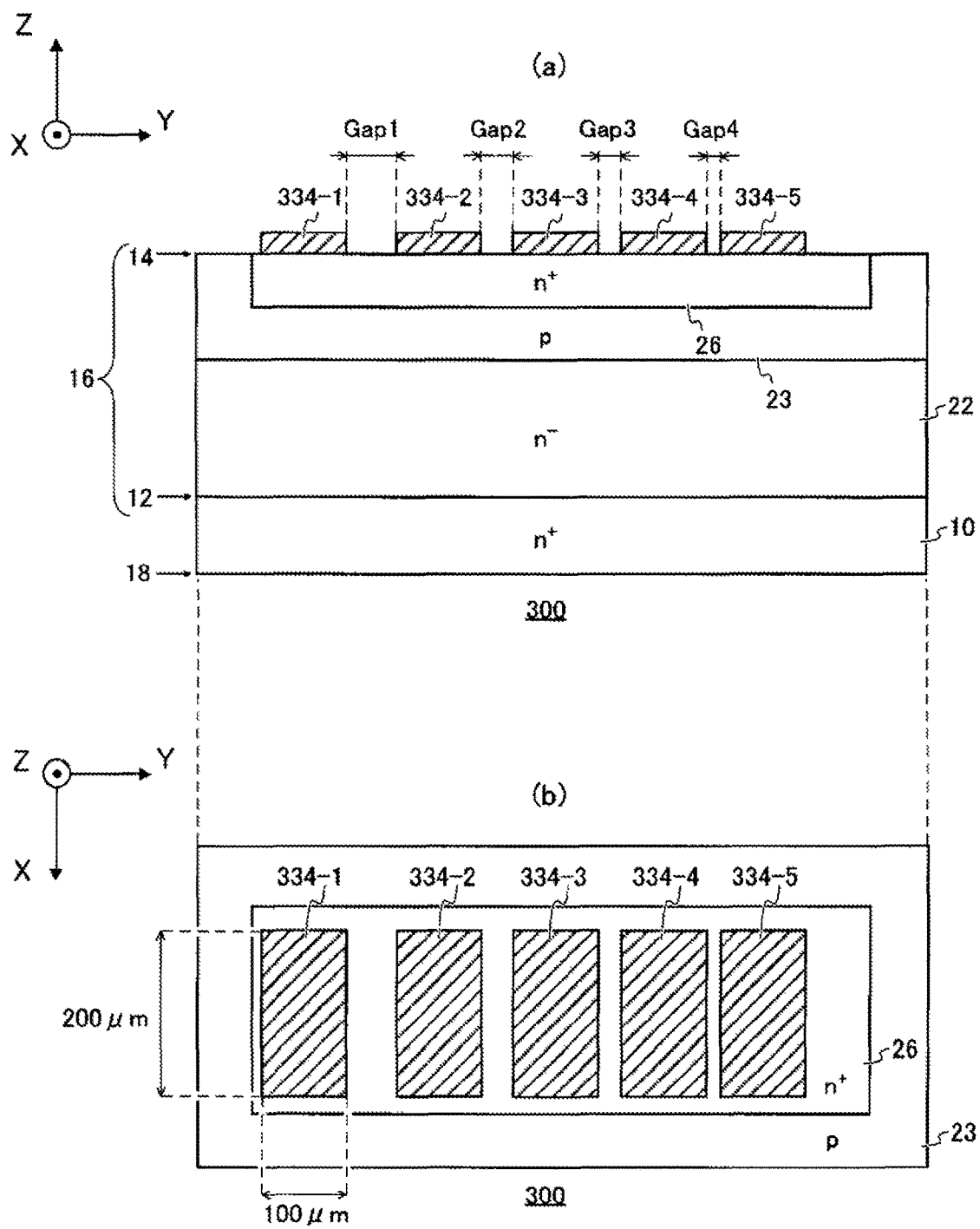
FIG. 10 shows (a) a side view and (b) a top view of a test apparatus 300 in an experiment example.

FIG. 10 is a figure showing a test apparatus 300 in an experiment example. (a) in FIG. 10 is a side view of the test apparatus 300, and (b) in FIG. 10 is a top view of the test apparatus 300. The test apparatus 300 has the GaN substrate 10, the GaN layer 16 and a plurality of electrodes 334. The GaN layer 16 of the present example has the drift region 22, a base region 23 and a source region 26 created by an approach similar to that for the vertical MOSFET 100 in the first embodiment.

The test apparatus 300 of the present example is used for calculating the resistance [Ω·μm] and sheet resistance [Ω/□] of the source region 26. The test apparatus 300 may be regarded as an apparatus that realizes a transmission line model (which is also in some cases abbreviated to the TLM model). In the test apparatus 300, current entering the source region 26 from one electrode 334 may flow in the Y-axis direction at the front surface 14. Then, current may be taken out from another electrode 334 that is adjacent thereto in the Y-axis direction. In the present example, voltage [V]-current [A] characteristics are measured by a transfer length method (which is also in some cases abbreviated to the TLM method) building on the TLM model. Then, based on the measured voltage [V]-current [A] characteristics, the resistance [Ω·μm] and sheet resistance [Ω/□] of the source region 26 are calculated.

Each among the plurality of electrodes 334 contacts the source region 26 on the source region 26. The plurality of electrodes 334 are separated from each other in the Y-axis direction. In the present example, five electrodes 334-1 to 334-5 are provided separately from each other in the Y-axis direction. Each electrode 334 has a rectangular parallelepiped shape having a length in the X-axis direction (which is also called the width) of 200 μm, a length in the Y-axis direction of 100 μm, and a predetermined thickness in the Z-axis direction. In the TLM method, the thickness of an electrode 334 in the Z-axis direction may be ignored.

The distance of separation between each pair of electrodes 334 that are adjacent to each other in the Y-axis direction is different from that for other pairs. In the present example, the gap length (Gap) between electrodes 334 that are adjacent to each other in the Y-axis direction is as follows.

The gap length between an electrode 334-1 and an electrode 334-2: Gap1=40 μm.

The gap length between the electrode 334-2 and an electrode 334-3: Gap2=32 μm.

The gap length between the electrode 334-3 and an electrode 334-4: Gap3=24 μm.

The gap length between the electrode 334-4 and an electrode 334-5: Gap4=16 μm.

Figure 11:
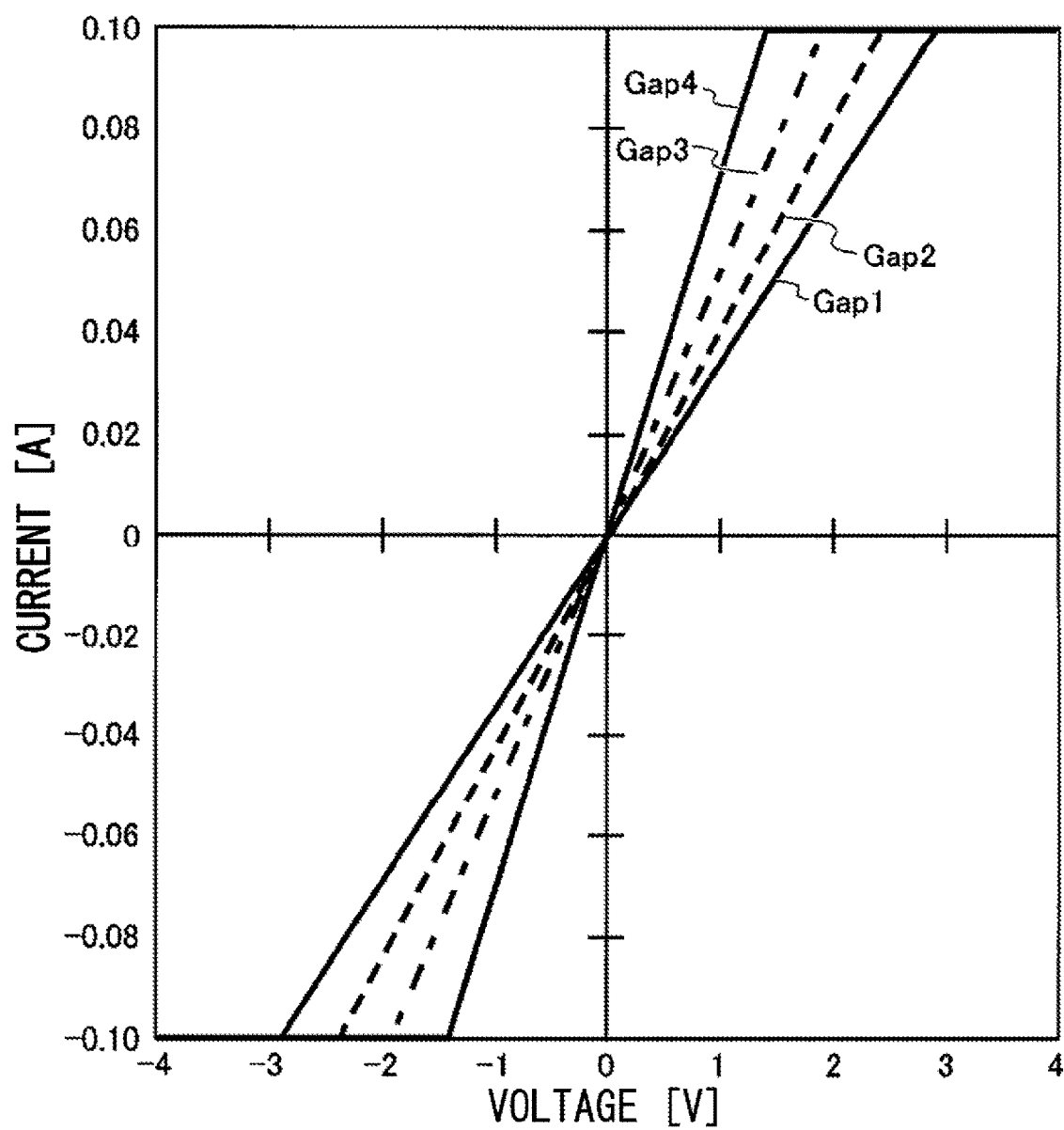
FIG. 11 is a figure showing voltage [V]-current [A] characteristics in the experiment example.

FIG. 11 is a figure showing voltage [V]-current [A] characteristics in the experiment example. The vertical axis indicates current values [A], and the horizontal axis indicates voltage values [V]. In FIG. 11, measurement results at Gap1 and Gap4 are indicated with a solid line, measurement results at Gap2 are indicated with a broken line, and measurement results at Gap3 are indicated with an alternate long and short dash line. As is obvious from FIG. 11, if a predetermined voltage is applied, the absolute value of current increases as the gap length between a pair of electrodes 334 decreases.

Figure 12:
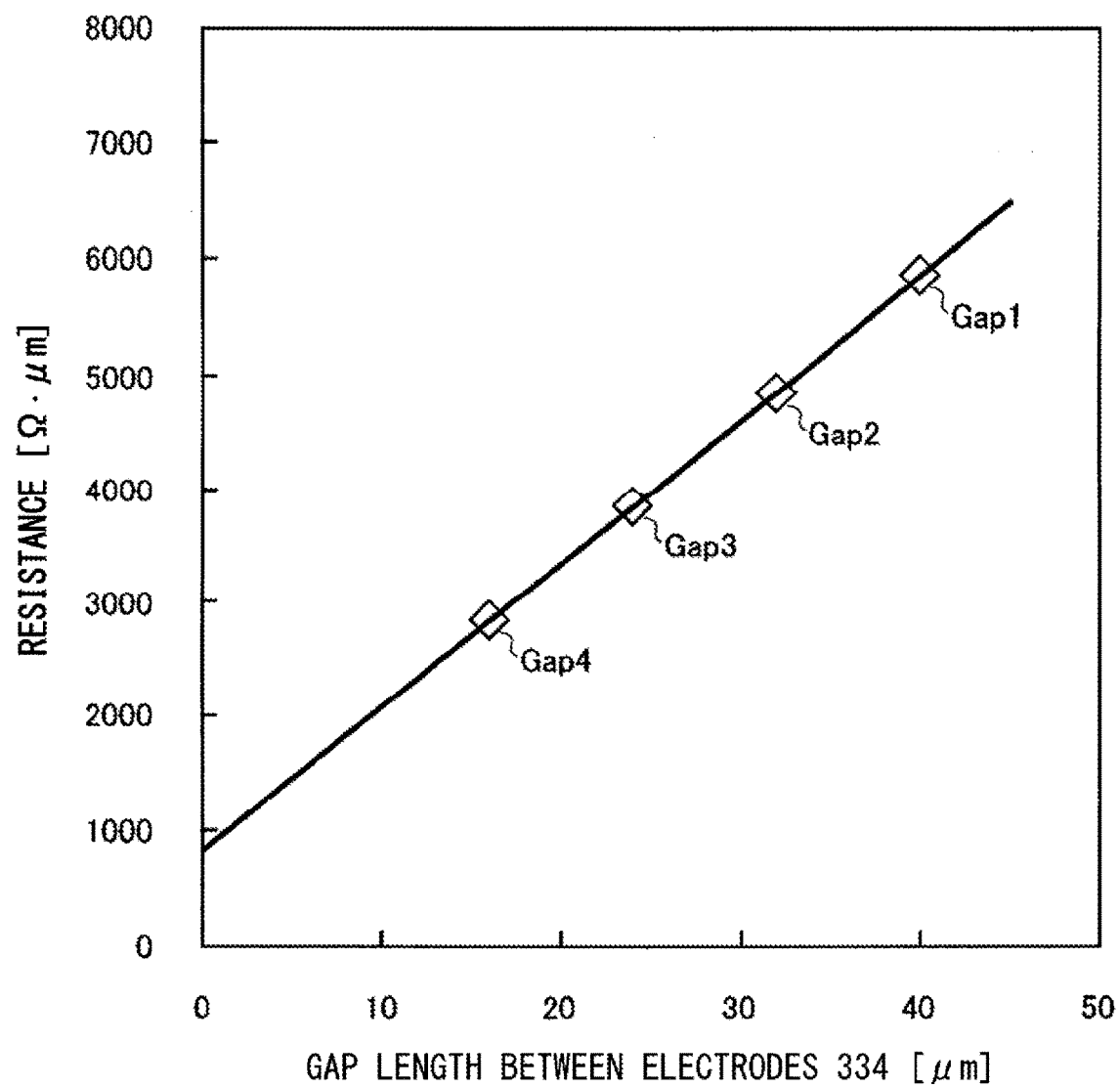
FIG. 12 is a figure showing the gap length [μm] between electrodes 334—the resistance [Ω·μm] per width of one electrode 334 in the experiment example.

FIG. 12 is a figure showing the gap length [μm] between electrodes 334—the resistance [Ω·μm] per width of one electrode 334 in the experiment example. The vertical axis indicates resistance [Ω·μm] per width of one electrode 334 (200 [μm] in the present example). In the present example, the resistance [Ω·μm] was calculated from the slope of each graph in FIG. 11. The horizontal axis indicates the gap length (Gap) [μm] between a pair of electrodes 334. In the present example, the gap length between a pair of electrodes 334 (that is, Gap) corresponds to values along the horizontal axis. Then, in the present example, the sheet resistance [Ω/□] of the source regions 26 was calculated from the slope of the graph in FIG. 12.

In the present example, the sheet resistance [Ω/□] of the source regions 26 was 126 [Ω/□]. However, the sheet resistance [Ω/□] of the source regions 26 may be no lower than 10 [Ω/□] or no lower than 50 [Ω/□] and no higher than 150 [Ω/□] or no higher than 200 [Ω/□]. If it is within the numerical range, they may be regarded as sufficiently low resistance source regions 26.

In contrast to this, "Sheet Res." of "TABLE I. Data on Implanted GaN" in Non-Patent Document 1 is $10^5$ [Ω/□] to $10^6$ [Ω/□]. In other words, the sheet resistance in Non-Patent Document 1 is classified the M (mega) Ω/□ class. In contrast to this, the sheet resistance of the source regions 26 of the present example is classified as the 100 Ω/□ class and so is sufficiently small. In this manner, the superiority of the source regions 26 in the embodiment of the present application is obvious. Although in the present example, the source regions 26 are created following the manufacturing process in the first embodiment, similar effects can be attained even if the source regions 26 are created following the manufacturing process of the second embodiment.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: GaN substrate; 12: boundary; 14: front surface; 16: GaN layer; 18: rear surface; 22: drift region; 23: base region; 24: channel formation region; 25: contact region; 26: source region; 32: gate insulating film; 34: gate electrode; 44: source electrode; 54: drain electrode; 100: vertical MOSFET; 110: mask; 120: mask; 130: photoresist mask; 132: screen film; 140: cap layer; 150: laminate; 200: thermal treatment apparatus; 300: test apparatus; 334: electrode

What is claimed is:

1. A vertical semiconductor apparatus comprising:
   a gallium nitride substrate;
   a gallium nitride semiconductor layer provided on the gallium nitride substrate;
   a p-type impurity region that is provided in the gallium nitride semiconductor layer and has an element to function as an acceptor for gallium nitride;
   an n-type impurity region that is provided in the p-type impurity region and has an element to function as a donor for gallium nitride; and
   an electrode provided in contact with a rear surface of the gallium nitride substrate, wherein
   the element to function as the donor in the n-type impurity region includes:
     a first impurity element that enters sites of gallium atoms in the gallium nitride semiconductor layer; and
     a second impurity element that is an element different from the first impurity element and enters sites of nitrogen atoms in the gallium nitride semiconductor layer, and
   in the n-type impurity region, a concentration of the first impurity element is higher than a concentration of the second impurity element.

2. The vertical semiconductor apparatus according to claim 1, wherein
   the first impurity element is silicon, and
   the second impurity element is oxygen.

3. The vertical semiconductor apparatus according to claim 1, wherein in the n-type impurity region, impurity concentration distributions of the first impurity element and the second impurity element have a tendency to decrease in a depth direction from a front surface of the gallium nitride semiconductor layer to a rear surface of the gallium nitride semiconductor layer.

4. The vertical semiconductor apparatus according to claim 1, wherein in the n-type impurity region, impurity concentration distributions of the first impurity element and the second impurity element have peaks in a range from a front surface of the gallium nitride semiconductor layer to a depth of 50 nm.

5. The vertical semiconductor apparatus according to claim 1, wherein
   an impurity concentration of the second impurity element at a bottom portion of the n-type impurity region is lower than an impurity concentration of the second impurity element at an upper portion of the n-type impurity region, and
   an impurity concentration of the second impurity element is no higher than 1E+17 cm$^{-3}$ in the p-type impurity region which is positioned below a boundary between the p-type impurity region and the n-type impurity region.

6. The vertical semiconductor apparatus according to claim 1, wherein an impurity concentration of the second impurity element in the n-type impurity region is no lower than 0.1% and no higher than 50% of an impurity concentration of the first impurity element in the n-type impurity region.

7. The vertical semiconductor apparatus according to claim 1, wherein an impurity concentration distribution of the element to function as the acceptor in the p-type impurity region includes a portion having a tendency to decrease in a depth direction from a front surface of the gallium nitride semiconductor layer to a rear surface of the gallium nitride semiconductor layer.

8. A semiconductor apparatus comprising:
   a gallium nitride semiconductor layer;
   a p-type impurity region that is provided in the gallium nitride semiconductor layer and has an element to function as an acceptor for gallium nitride; and
   an n-type impurity region that is provided in the p-type impurity region and has an element to function as a donor for gallium nitride, wherein
   the element to function as the donor in the n-type impurity region includes:
     a first impurity element that enters sites of gallium atoms in the gallium nitride semiconductor layer; and
     a second impurity element that is an element different from the first impurity element and enters sites of nitrogen atoms in the gallium nitride semiconductor layer,
   in the n-type impurity region, a concentration of the first impurity element is higher than a concentration of the second impurity element, a bottom portion of the n-type impurity region is shallower than a bottom portion of the p-type impurity region, and an impurity concentration distribution of the element to function as the acceptor in the p-type impurity region positioned below the n-type impurity region and an impurity concentration distribution of the element to function as the acceptor in the p-type impurity region not positioned below the n-type impurity region are the same.

9. A vertical semiconductor apparatus comprising:

a gallium nitride substrate;

a gallium nitride semiconductor layer provided on the gallium nitride substrate;

a p-type impurity region that is provided in the gallium nitride semiconductor layer and has an element to function as an acceptor for gallium nitride;

an n-type impurity region that is provided in the p-type impurity region and has an element to function as a donor for gallium nitride; and an electrode provided in contact with a rear surface of the gallium nitride substrate, wherein the element to function as the donor in the n-type impurity region includes:
    a first impurity element that enters sites of gallium atoms in the gallium nitride semiconductor layer; and
    a second impurity element that is an element different from the first impurity element and enters sites of nitrogen atoms in the gallium nitride semiconductor layer, in the n-type impurity region, a concentration of the first impurity element is higher than a concentration of the second impurity element, and impurity concentration distributions of the first impurity element and the second impurity element in the n-type impurity region have flat regions ranging from a front surface of the gallium nitride semiconductor layer to a predetermined depth in the n-type impurity region.

10. A vertical semiconductor apparatus manufacturing method comprising:

implanting ions of an element to function as a donor for gallium nitride into a region that: is provided in a gallium nitride semiconductor layer on a gallium nitride substrate; has an element to function as an acceptor for gallium nitride; and is to be a p-type impurity region after thermal treatment, so as to form an n-type impurity region in the region to be the p-type impurity region after the thermal treatment; and forming an electrode to contact a rear surface of the gallium nitride substrate, wherein the n-type impurity region includes, as the element to function as the donor:
    a first impurity element that enters sites of gallium atoms in the gallium nitride semiconductor layer; and
    a second impurity element that is an element different from the first impurity element and enters sites of nitrogen atoms in the gallium nitride semiconductor layer, and in the n-type impurity region, a concentration of the first impurity element is higher than a concentration of the second impurity element.

11. The vertical semiconductor apparatus manufacturing method according to claim 10, further comprising performing thermal treatment on the gallium nitride semiconductor layer at temperature no lower than 1000° C. after the implanting ions of the element to function as the donor into the region to be the p-type impurity region.

12. The vertical semiconductor apparatus manufacturing method according to claim 10, wherein in the implanting ions of the element to function as the donor into the region to be the p-type impurity region, ions of the first impurity element are implanted into the region to be the p-type impurity region through a thin film made of silicon oxide provided on the gallium nitride semiconductor layer, thereby introducing the second impurity element included in the thin film into the region to be the p-type impurity region.

13. A vertical semiconductor apparatus manufacturing method comprising:

implanting ions of an element to function as a donor for gallium nitride into a region that: is provided in a gallium nitride semiconductor layer on a gallium nitride substrate; has an element to function as an acceptor for gallium nitride; and is to be a p-type impurity region after thermal treatment, so as to form an n-type impurity region in the region to be the p-type impurity region after the thermal treatment; and forming an electrode to contact a rear surface of the gallium nitride substrate, wherein the n-type impurity region includes, as the element to function as the donor:
    a first impurity element that enters sites of gallium atoms in the gallium nitride semiconductor layer; and
    a second impurity element that is an element different from the first impurity element and enters sites of nitrogen atoms in the gallium nitride semiconductor layer, in the n-type impurity region, a concentration of the first impurity element is higher than a concentration of the second impurity element, and in the implanting ions of the element to function as the donor for the gallium nitride into the region to be the p-type impurity region, ions of the first impurity element and the second impurity element are implanted into the region to be the p-type impurity region.

14. The vertical semiconductor apparatus manufacturing method according to claim 13, further comprising, prior to the forming the n-type impurity region, implanting ions of the element to function as the acceptor for the gallium nitride semiconductor layer, so as to form the p-type impurity region.

* * * * *